United States Patent
Davis et al.

(10) Patent No.: US 8,987,892 B2
(45) Date of Patent: Mar. 24, 2015

(54) METHOD FOR CREATING A SELECTIVE SOLDER SEAL INTERFACE FOR AN INTEGRATED CIRCUIT COOLING SYSTEM

(71) Applicant: Raytheon Company, Waltham, MA (US)

(72) Inventors: William J. Davis, Hollis, NH (US); David H. Altman, Framingham, MA (US)

(73) Assignee: Raytheon Company, Waltham, MA (US)

( * ) Notice: Subject to any disclaimer, the term of this patent is extended or adjusted under 35 U.S.C. 154(b) by 24 days.

(21) Appl. No.: 13/891,490

(22) Filed: May 10, 2013

(65) Prior Publication Data

US 2014/0332949 A1    Nov. 13, 2014

(51) Int. Cl.
| | | |
|---|---|---|
| H01L 23/46 | (2006.01) | |
| B23P 15/26 | (2006.01) | |
| H01L 23/373 | (2006.01) | |
| H01L 23/473 | (2006.01) | |
| H01L 21/48 | (2006.01) | |
| H05K 1/02 | (2006.01) | |

(52) U.S. Cl.
CPC ............. *H01L 23/46* (2013.01); *B23P 15/26* (2013.01); *H01L 23/3735* (2013.01); *H01L 23/473* (2013.01); *H01L 21/4882* (2013.01); *H05K 1/0272* (2013.01); *H05K 2201/064* (2013.01)
USPC ........................................ 257/712; 29/890.54

(58) Field of Classification Search
CPC ............................... H01L 23/46; H01L 23/473
USPC ............................................. 257/712, 713, 714
See application file for complete search history.

(56) References Cited

U.S. PATENT DOCUMENTS

| | | | |
|---|---|---|---|
| 5,360,471 A | | 11/1994 | Takano et al. |
| 6,131,650 A | * | 10/2000 | North et al. ............ 165/170 |
| 6,919,231 B1 | * | 7/2005 | Ramanathan et al. ........ 438/122 |

(Continued)

FOREIGN PATENT DOCUMENTS

| | | |
|---|---|---|
| EP | 1 628 515 A2 | 2/2006 |
| EP | 1 796 138 A2 | 6/2007 |
| WO | WO 98/03997 | 1/1998 |

OTHER PUBLICATIONS

Joe Dix, Amir Jokar, Robert Martinsen, Enhanced Microchannel Cooling for High-Power Semiconductor Diode Lasers, SPIE vol. 6876, 687606, 2008, pp. 1-10.

(Continued)

*Primary Examiner* — Lex Malsawma
*Assistant Examiner* — J. R. Oakley
(74) *Attorney, Agent, or Firm* — Daly, Crowley, Mofford & Durkee, LLP

(57) ABSTRACT

A method for forming cooling channels in an interface for soldering to a semiconductor structure. The method includes: forming a metal seed layer on a surface of a substrate; patterning the metal seed layer into a patterned, plating seed layer covering portions of the substrate and exposing other portions of the substrate; using the patterned plating seed layer to form channels through the exposed portions of the substrate; and plating the patterned plating seed layer with solder. A heat exchanger having cooling channels therein is affixed to one surface of the interface and the semiconductor structure is soldered to an opposite surface of the interface. The cooling channels of the heat exchanger are aligned with the channels in the interface.

14 Claims, 5 Drawing Sheets

(56) References Cited

U.S. PATENT DOCUMENTS

| | | | |
|---|---|---|---|
| 7,078,613 | B2 | 7/2006 | Spivack et al. |
| 8,563,365 | B2 * | 10/2013 | King et al. .................... 438/122 |
| 2003/0022505 | A1 | 1/2003 | Ouellet et al. |
| 2003/0085024 | A1 * | 5/2003 | Santiago et al. ......... 165/104.11 |
| 2005/0211417 | A1 | 9/2005 | Upadhya et al. |
| 2005/0211418 | A1 * | 9/2005 | Kenny et al. ................. 165/80.4 |
| 2005/0277280 | A1 | 12/2005 | Brunschwiler et al. |
| 2006/0011326 | A1 * | 1/2006 | Yuval ........................... 165/80.4 |
| 2007/0063337 | A1 * | 3/2007 | Schubert et al. .............. 257/714 |
| 2009/0120669 | A1 * | 5/2009 | Hoofman ..................... 174/252 |
| 2009/0284921 | A1 * | 11/2009 | Colgan et al. ................. 361/699 |
| 2010/0276792 | A1 | 11/2010 | Chi et al. |
| 2011/0272452 | A1 | 11/2011 | Lam et al. |
| 2012/0119341 | A1 | 5/2012 | Warren et al. |
| 2012/0152482 | A1 * | 6/2012 | Osanai ......................... 164/112 |
| 2012/0153455 | A1 | 6/2012 | Mizuno et al. |

OTHER PUBLICATIONS

Joe Dix, Amir Jokar, Robert Martinsen, Enhanced Microchannel Cooling for High-Power Semiconductor Diode Lasers, Washington State University, Vancouver, SPIE Photonics West, Jan. 21, 2008, pp. 1-21.

Notification of Transmittal of the International Search Report and the Written Opinion of the International Searching Authority, or the Declaration, PCT/US2014/031721, Jul. 25, 2014, 1 page.

International Search Report, PCT/US2014/031721, Jul. 25, 2014, 4 pages.

Written Opinion of the International Searching Authority, PCT/US2014/031721, Jul. 25, 2014, 7 pages.

* cited by examiner

METHOD FOR CREATING A SELECTIVE SOLDER SEAL INTERFACE FOR AN INTEGRATED CIRCUIT COOLING SYSTEM

TECHNICAL FIELD

This disclosure relates generally to integrated circuit cooling systems and more particularly to micro channel cooling systems wherein a microchannel interface is soldered to the back side of a semiconductor structure.

BACKGROUND

As is known in the art, one technique used to cool integrated circuits is to form an interface having liquid coolant micro channels therein and soldered the interface to the back surface of a semiconductor structure, such as a Monolithic Microwave Integrated Circuit (MMIC) or a high power semiconductor amplifier device, for example. One method used to form such an interface is to first form the micro channels in the interface and then deposit the solder selectively on the ends of the interface terminating at the sidewalls of the interface forming the micro channels. This selective deposition performed after defining etched features would typically be achieved by sputtering or depositing metal onto the entire surface including into the etched features and then having to remove it or cover it to prevent deposition of the solder material. These typical process steps require complicated lift-off of thick film or etch back of unwanted material. This requires complex thick photolithography steps or hard to control etch steps.

SUMMARY

In accordance with the present disclosure, a method is provided for forming cooling channels in an interface for soldering to a semiconductor structure. The method includes: forming a seed layer on a surface of a substrate; patterning the seed layer into a patterned plating seed layer covering portions of the substrate and exposing other portions of the substrate; using the patterned plating seed layer to form channels through the exposed portions of the substrate; and plating solder on the patterned plating seed layer. A heat exchanger having cooling channels therein is affixed to one surface of the interface and the semiconductor structure is soldered to an opposite surface of the interface. The cooling channels of the heat exchanger are aligned with the channels in the interface.

With such method, the patterned plating seed layer is formed simultaneously with the formation of the etchant mask.

In one embodiment, the method includes: forming a seed layer on a surface of a substrate; lithographically forming a patterned layer of a first material having windows therein exposing selected regions of the seed layer; forming an etchant mask on portions of a surface of the seed layer in the windows of the first material; removing the first material leaving the etchant mask on the portions of the surface of the seed layer, The method then, using the etchant mask, includes applying an etchant to the etchant mask to: etch exposed portions of the seed layer forming a patterned plating seed layer, and etch upper portions 3 of underlying portions of the substrate while leaving lower portions of the underlying portions of the substrate. Then, the method, using the etchant mask, includes removing portions of the surface of the substrate between the lower portions of the substrate and adjacent portions of the substrate underlying the etchant mask; forming slots through the substrate between the lower portions of the substrate and the adjacent portions of the substrate underlying the etchant mask; removing the etchant mask and leaving unetched portions of the seed layer as an plating seed layer disposed on the substrate; and plating the seed layer disposed on the substrate with solder;

In one embodiment, the heat exchanger is soldered to the interface;

In one embodiment, the heat exchanger is ionically bonded to the interface.

In one embodiment, a structure is provided comprising: a semiconductor structure; a heat exchanger having a plurality of heat exchanger cooling channels; and an interface disposed between the semiconductor structure and the heat exchanger.

The interface has a plurality of interface channels aligned with the plurality of heat exchanger cooling channels. The interface comprises: a thermally conductive substrate; and a seed layer disposed on the thermally conductive substrate. The interface channels pass through the thermally conductive substrate and the underlying seed layer. The interface includes a layer of solder plated on the seed layer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
FIGS. 1A-1I are simplified, cross sectional sketches of a cooling interface at various steps in the fabrication thereof according to the disclosure.
Figure 1B:
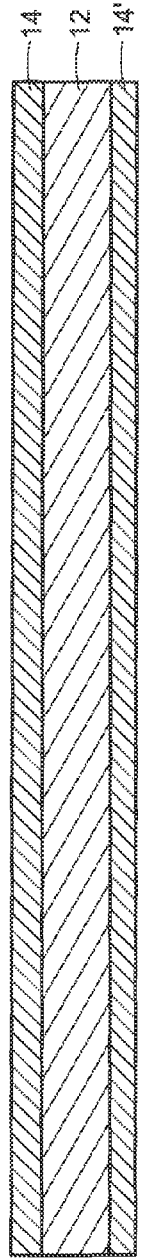
Figure 1C:
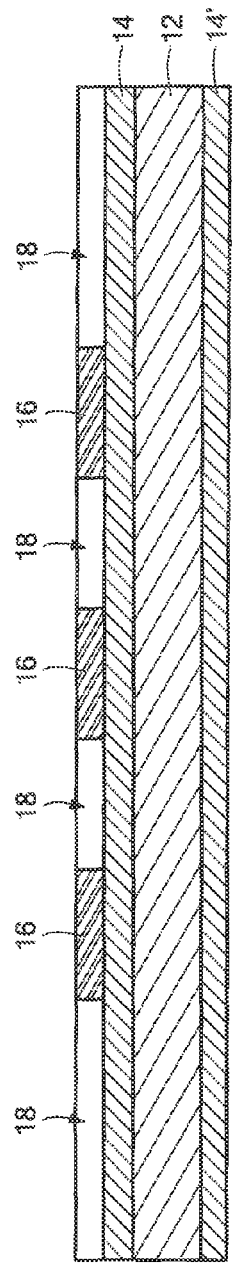

Referring now to FIG. 1A, a thermally conductive substrate 12, here diamond or SiC or Si, for example, is provided. A seed layer 14, here a metal seed layer, for example, a two layered structure having a lower layer of an alloy of titanium and tungsten and an upper layer of gold (TiW/Au) or a three layer structure having a lower layer of an alloy of titanium and tungsten, a middle layer of nickel and an upper layer of gold (TiW/Ni/Au), is deposited, here for example sputtered or evaporated, on the upper surface of the substrate 12 as shown in FIG. 1B. A similar metal seed layer 14' is deposited, here for example sputtered or evaporated, on the bottom surface of the substrate 12 as shown in FIG. 1B. It is noted that the seed layers 14, 14' will be patterned into a plating seed. layer that will carry current to plate the patterned seed layer with solder, in a manner to be described. It is noted that the plating may be electroplating or electroless plating. Suffice it to say here, that next, a photoresist layer 16 is deposited on the metal seed layer 14 on the upper surface of the substrate 12 and is lithographically processed using, here for example, conventional mask, not shown, and optical lithography pattern the photoresist layer 16 with windows 18 which expose portions of the surface of the metal seed layer 14, as shown in FIG. 1C.

Figure 1D:
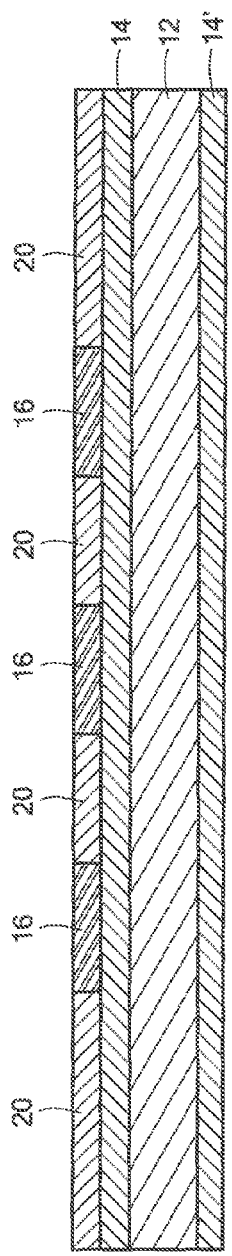
Figure 1E:
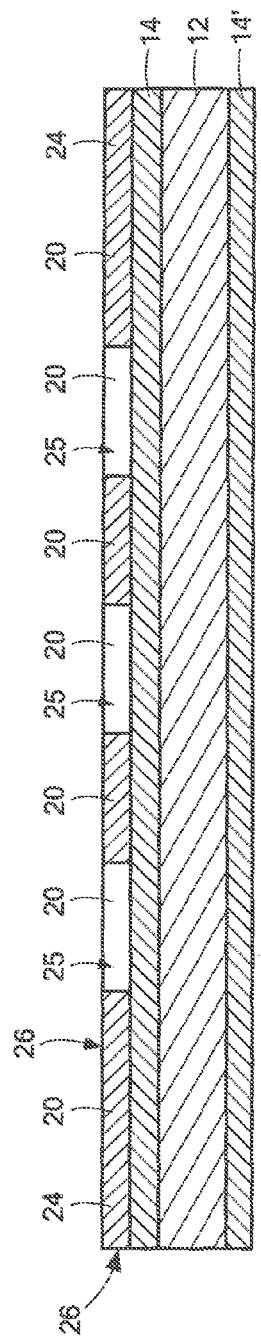

An etchant mask material 20, here nickel, is then deposited on the exposed portions of the metal seed layer 14, here for example, by electroplating on the exposed portions of the metal seed layer 14, as shown in FIG. 1D. Next, the photoresist layer 16 is removed in any conventional manner leaving the material 20 providing an etchant mask 22 shown in FIG. 1E. More particularly, portions 24 of the material 20 are disposed on underlying portions of the metal seed layer 14 and windows 25 in the material 20 expose portions of the metal seed layer 14. The etchant mask is a hard mask required to etch the substrate 12 in a manner to be described.

Figure 1F:
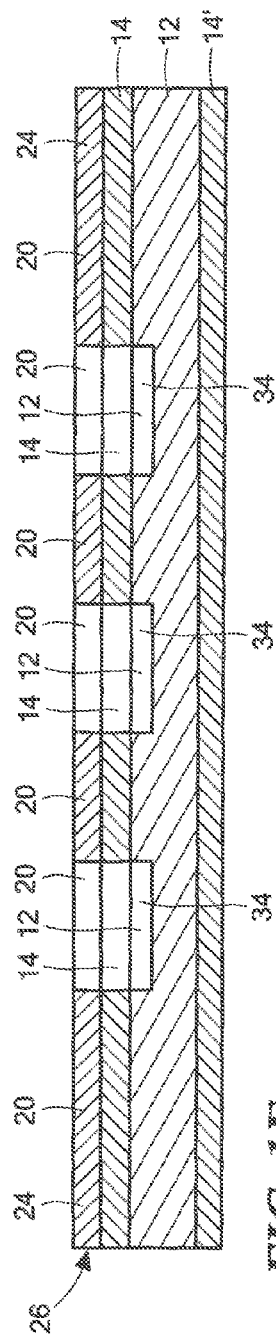

Next, using the etchant mask 26, an etchant, here for example, SF6 and O2 is brought into contact with the masked portions 24 and unmasked portions (the portions exposed by the windows 25) of the metal seed layer 14. The etchant is selective and completely etch through the exposed portions of the metal seed layer 14 and partially into the upper portions 34 of the underlying exposed portions of the substrate 12, as shown in FIG. 1F. It should be noted that the remaining, unetched portions of the metal seed layer 14 will provide the above-mentioned, patterned, plating seed layer. Here, the etchant is for example a fluorine based plasma and the etching termination is based on known etch rates and the desired depth of the etch into the substrate 12.

Figure 1G:
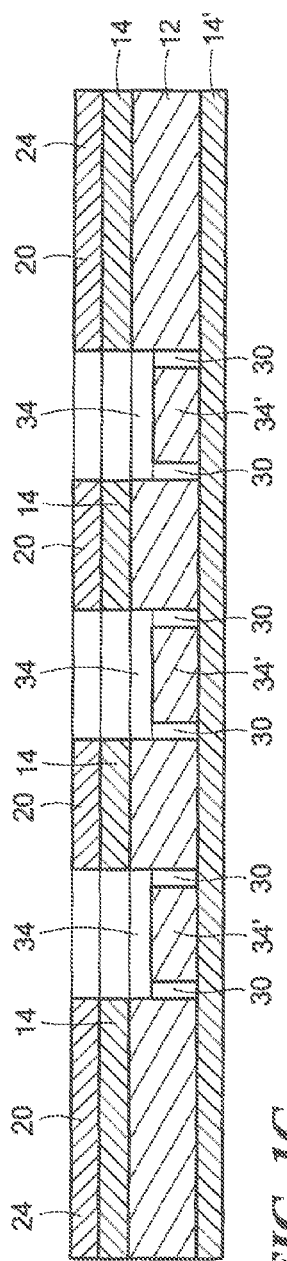

Next, using the etchant mask 26, portions of the surface of the substrate 12 between the lower portions 34' of the substrate 12 and adjacent portions of the substrate 12 underlying the etchant mask 26 are removed, here for example, with a laser or Inductively Coupled Plasma (ICP) etching, not shown, forming slots 30 through the substrate 12 between the lower portions 34' of the substrate 12 and the adjacent portions of the substrate 12 underlying the etchant mask 26, as shown in FIG. 1G. The laser removal may be performed using any conventional computer aided patterns (one example of laser scribing). It is noted that the laser is also used to remove underlying portions of the layer 14', as shown in FIG. 1H thereby forming slots 30 through the substrate 12 and layer 14", as shown.

Next, the mask 26 is removed here, for example using a wet etch selective to metal seed layer pattern 14, such as for example $H_2SO_4:H_2O_2:H_2O$ leaving patterned portions of the metal seed layer 14 as shown in FIG. 1G, such patterned portions of seed layer 14 providing the above-mentioned patterned plating seed layer, here indicated by the numerical designation 40.

Figure 1H:
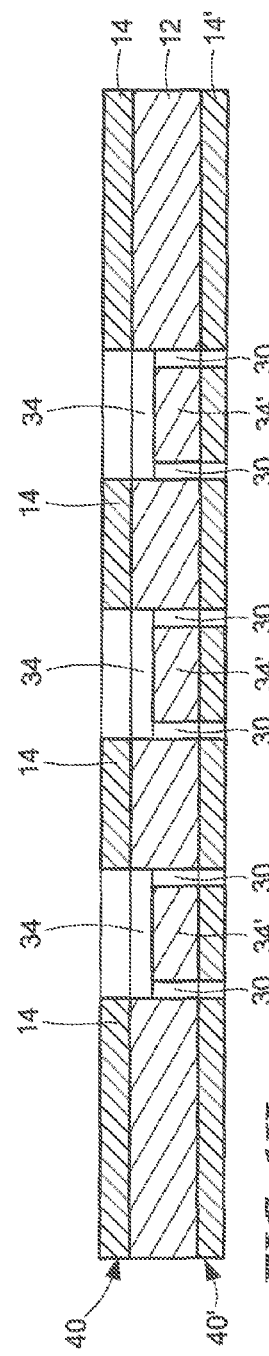
Figure 1I:
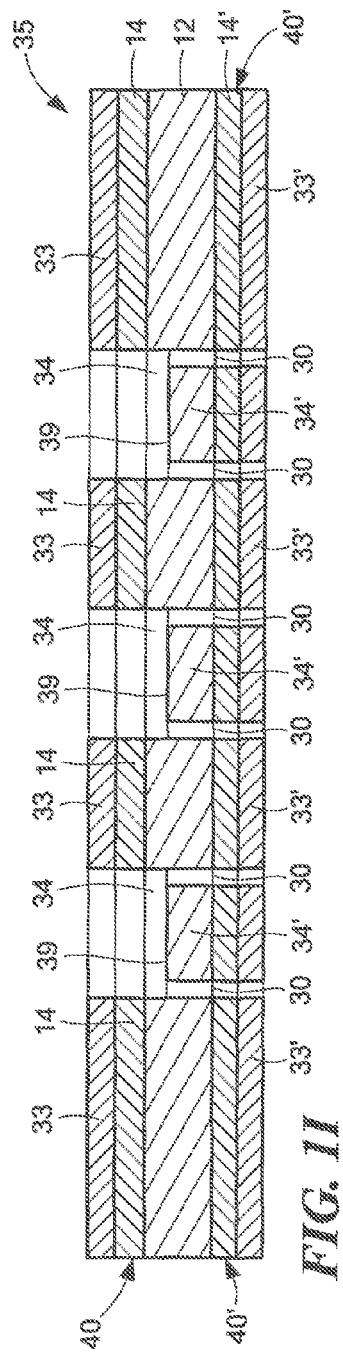
Figure 2A:
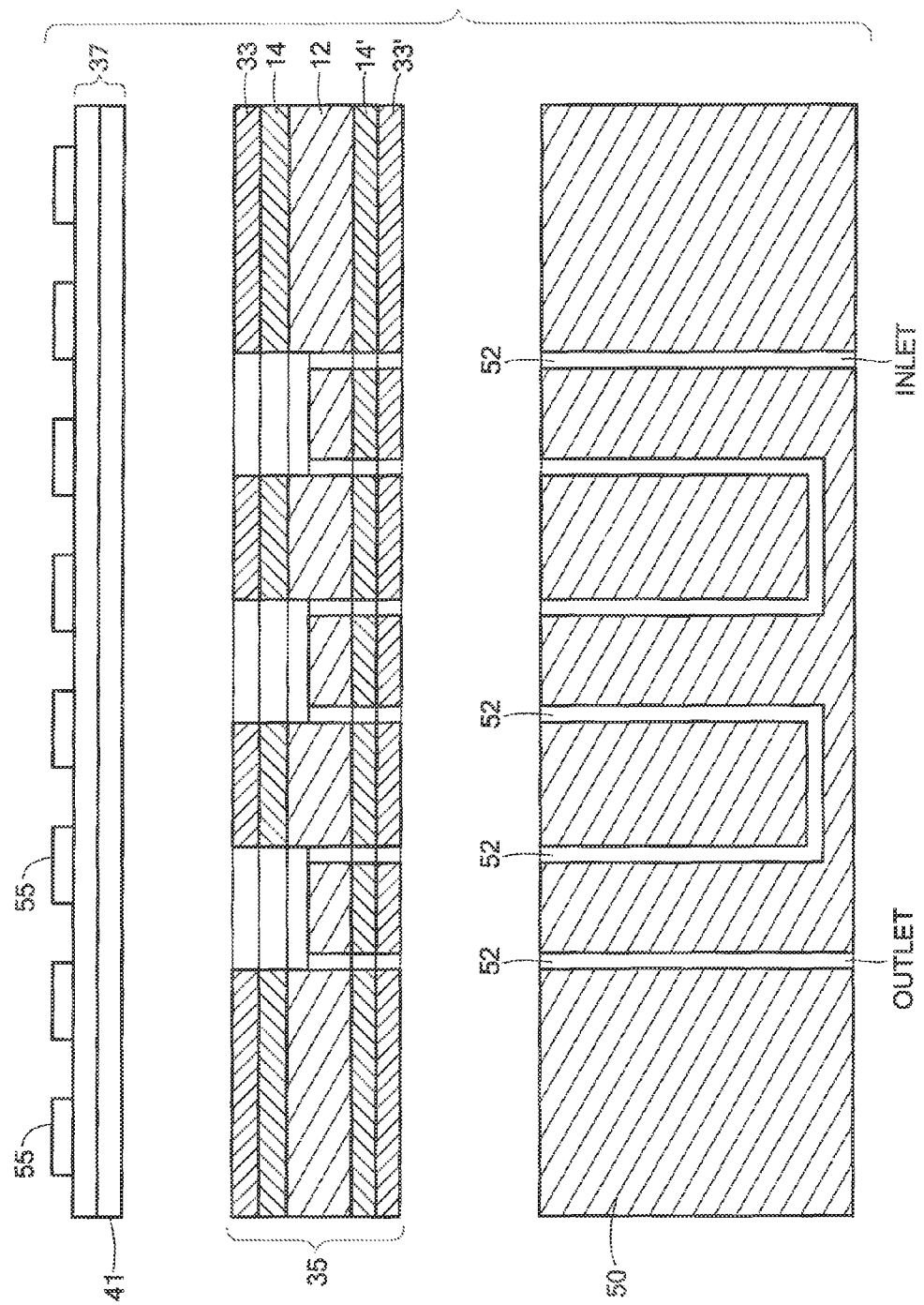
FIG. 2A. is an exploded view of the cooling interface of FIG. 1H disposed between a MMIC and a heat exchanger according to the disclosure.
Figure 2B:
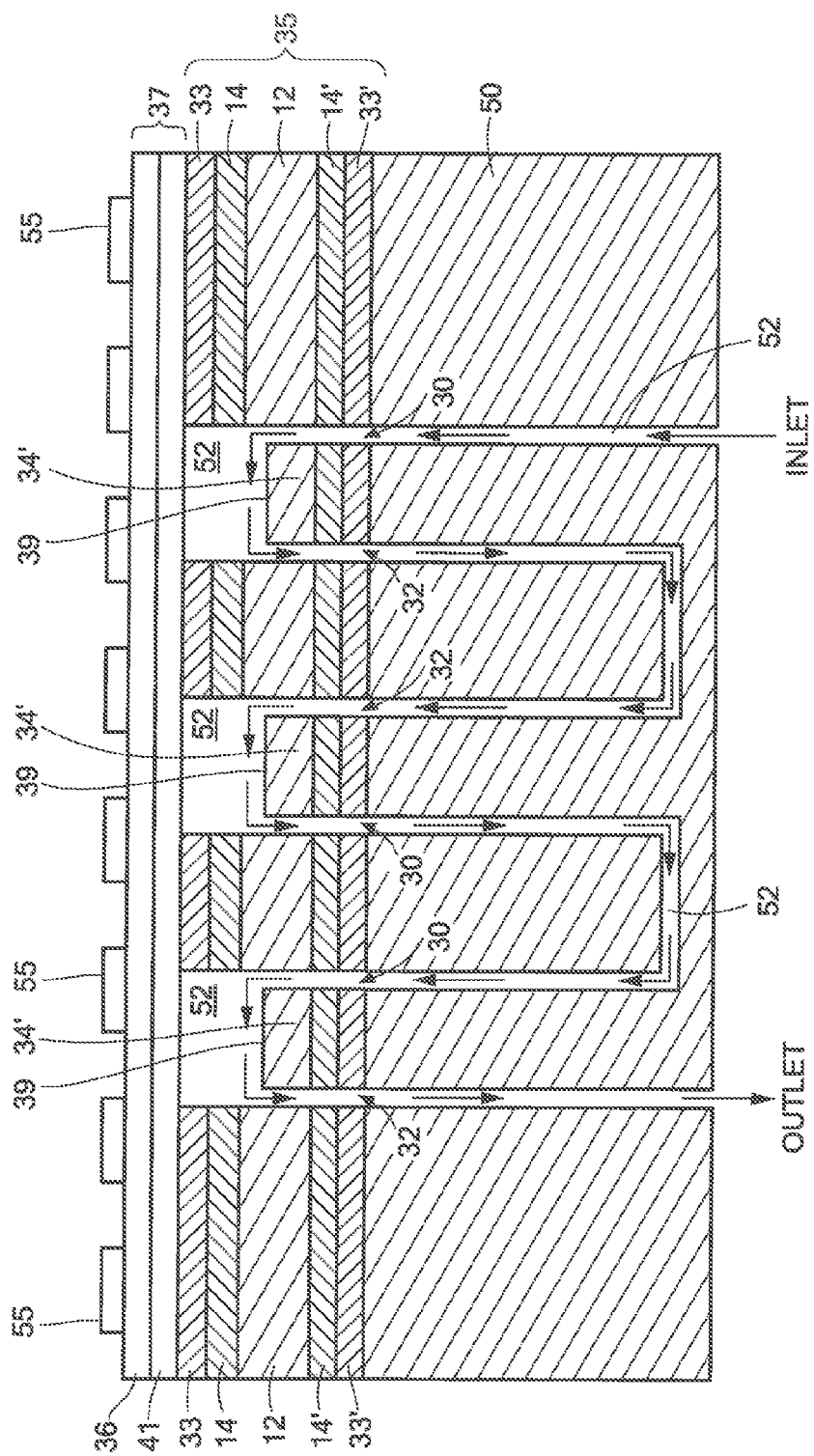
FIG. 2B is a cross sectional sketch of the cooling interface of FIG. 1H bolder to a MMIC and a heat exchanger according to the disclosure.

Next, solder 33, 33' is plated onto the patterned portions of layers 14 and 14', respectively, (i.e., onto the patterned, plating seed layers 40, 40') as shown in FIG. 1H thereby completing a cooling interface structure 35. Here the solder 33, 33' is, for example a thin (3-8 μm thick) eutectic of Au/Sn or Sn/Pb or other eutectic solder that is appropriate for attachment to a semiconductor structure, (MMIC or power amplifier chip, for example). It is first noted that the solder 33, 33' is only plated to the top surface of layers 14. 14' and not into the channels because of the selective metal seed layer (i.e., the patterned plating metal seed layer 14) which was co-defined during the channel forming etch, i.e., using the etchant mask. That is, the patterned plating seed layer was formed simultaneously with the formation of the etchant mask. The substrate 12 with solder seal layer 33, 33' is then singulated and attached to the mating semiconductor structure substrate where the channels remain open after attachment and a seal is formed to contain cooling fluids used to remove heat from the active device backside of the semiconductor structure. It is also noted that the slots 30 form sidewalls of cooling channels 52 and the surfaces 39 of the lower portions 34' of the substrate 12 form the tops 39 of the channels 53. It is also noted that the solder 33 is now only on the raised part of the channels 52 and is used to hermetically attach the interface 35 directly to the semiconductor structure 37 (MMIC chip having active and passive devices 55 on the top side of a semiconductor substrate 36 and a conductive layer 41 on the backside (FIGS. 2A and 2B) which will be cooled as shown in FIGS. 2A and 2B; whereas the solder 33' on the back side of the interface 35 is used to solder the bottom surface of the interface 35 (FIG. 1I) to the heat exchanger 50, as shown in FIGS. 2A and 2B. Thus, the solder 33 is used to directly bond the cooling interface 35 to the back side of the MMIC chip 41. The heat exchanger 50 has channels 52 for receiving a fluid coolant and for exiting the coolant after having passed through the channels 42 as indicated by the arrows in FIG. 2B. It is noted that the channels 52 the cooling structure are aligned with the channels in the interface and form cooling closed loops portions contiguous the bottom surface of the semiconductor structure 37 (MMIC chip), This attachment to the semiconductor structure 37 can now occur without filling the channels with solder thereby allowing maximum cooling directly to the semiconductor structure backside because of the thin thermal interface.

A number of embodiments of the disclosure have been described. Nevertheless, it will be understood that various modifications may be made without departing from the spirit and scope of the disclosure. For example, the bottom of the interface may be bonded to the heat exchanger by other than solder; for example by oxide ionic bonding or thermal oxide bonding or in situ plasma wafer bonding methods known in the state of the art. Accordingly, other embodiments are within the scope of the following claims.

What is claimed is:

1. A method for forming cooling channels in an interface for soldering to a semiconductor structure, comprising:
   forming a seed layer on a surface of a substrate;
   patterning the seed layer into a patterned, plating seed layer covering portions of the substrate and exposing other portions of the substrate;
   using the patterned plating seed layer to form channels through the exposed portions of the substrate; and
   plating the patterned plating seed layer with solder.

2. The method recited in claim 1 including soldering the solder of the plating seed layer the interface to the semiconductor structure.

3. The method recited in claim 1 including affixing the interface to a fluid cooling heat exchanger.

4. The method recited in claim 3 wherein the heat exchanger has channels therein and wherein the heat exchanger channels are aligned with the interface channel.

5. The method recited in claim 4 wherein the heat exchanger is affixed to one surface of the interface and the semiconductor structure is soldered to an opposite surface of the interface.

6. The method recited in claim 5 wherein the heat exchanger is soldered to the interface.

7. The method recited in claim 5 wherein the heat exchanger is ionically bonded to the interface.

8. A method for forming cooling channels in an interface for soldering to a semiconductor structure, comprising:
   forming a seed layer on a surface of a substrate;
   lithographically forming a patterned layer of a first material having windows therein exposing selected regions of the seed layer;
   forming an etchant mask on portions of a surface of the seed layer in the windows of the first material;
   removing the first material leaving the etchant mask on the portions of the surface of the seed layer;
   using the etchant mask, applying an etchant to the etchant mask to:

etch exposed portions of the seed layer forming a plating mask, and etch upper portions of underlying portions of the substrate while leaving lower portions of the underlying portions of the substrate;

using the etchant mask, removing portions of the surface of the substrate between the lower portions of the substrate and adjacent portions of the substrate underlying the etchant mask forming slots through the substrate between the lower portions of the substrate and the adjacent portions of the substrate underlying the etchant mask;

removing the etchant mask and leaving unetched portions of the seed layer as a patterned, plating seed layer disposed on the substrate;

plating solder on the patterned, plating seed layer.

9. The method recited in claim 8 including soldering the solder on the interface to the semiconductor structure.

10. The method recited in claim 8 including affixing the interface to a fluid cooling heat exchanger.

11. The method recited in claim 10 wherein the heat exchanger has channels therein and wherein the heat exchanger channels are aligned with the interface channel.

12. The method recited in claim 11 wherein the heat exchanger is affixed to one surface of the interface and the semiconductor structure is soldered to an opposite surface of the interface.

13. The method recited in claim 12 wherein the heat exchanger is soldered to the interface.

14. The method recited in claim 12 wherein the heat exchanger is ionically bonded to the interface.

\* \* \* \* \*